United States Patent [19]

Carroll et al.

[11] Patent Number: 4,684,801
[45] Date of Patent: Aug. 4, 1987

[54] SIGNAL PRECONDITIONING FOR TOUCH ENTRY DEVICE

[75] Inventors: Arthur B. Carroll; Stewart E. Hough, both of Georgetown; Paul R. Hunter, Austin; John K. Carstedt, Round Rock; Sam R. Shaw, Austin; James E. Garrett, Round Rock, all of Tex.

[73] Assignee: Carroll Touch Inc., Round Rock, Tex.

[21] Appl. No.: 835,015

[22] Filed: Feb. 28, 1986

[51] Int. Cl.$^4$ .............................................. G09G 1/28
[52] U.S. Cl. ..................................... 250/221; 340/712; 340/706
[58] Field of Search ................ 250/221, 549; 340/706, 340/712, 365 P, 555, 556, 557, 709

[56] References Cited

U.S. PATENT DOCUMENTS

| | | | |
|---|---|---|---|
| 4,459,476 | 7/1984 | Weissmueller et al. | 250/221 |
| 4,590,410 | 5/1986 | Jönsson | 250/221 |
| 4,591,710 | 5/1986 | Komadina et al. | 250/221 |

Primary Examiner—Edward P. Westin
Assistant Examiner—Jessica Ruoff
Attorney, Agent, or Firm—Robert W. Pitts

[57] ABSTRACT

A touch entry system employing arrays of emitter and detector opto devices located around the periphery of an irradiated field detects intrusion of an opaque element such as a stylus within the field. The detector analog output is converted to a digital signal for input into a microprocessor. Digital signals input into the microprocessor can vary due to inconsistencies in conventional opto devices. A programmable amplifier responsive to the microprocessors preconditions the analog signals prior to analog to digital conversion to bring all digital signals corresponding to the unblocked emitter beam condition within a normalized range before input into the microprocessor.

12 Claims, 10 Drawing Figures

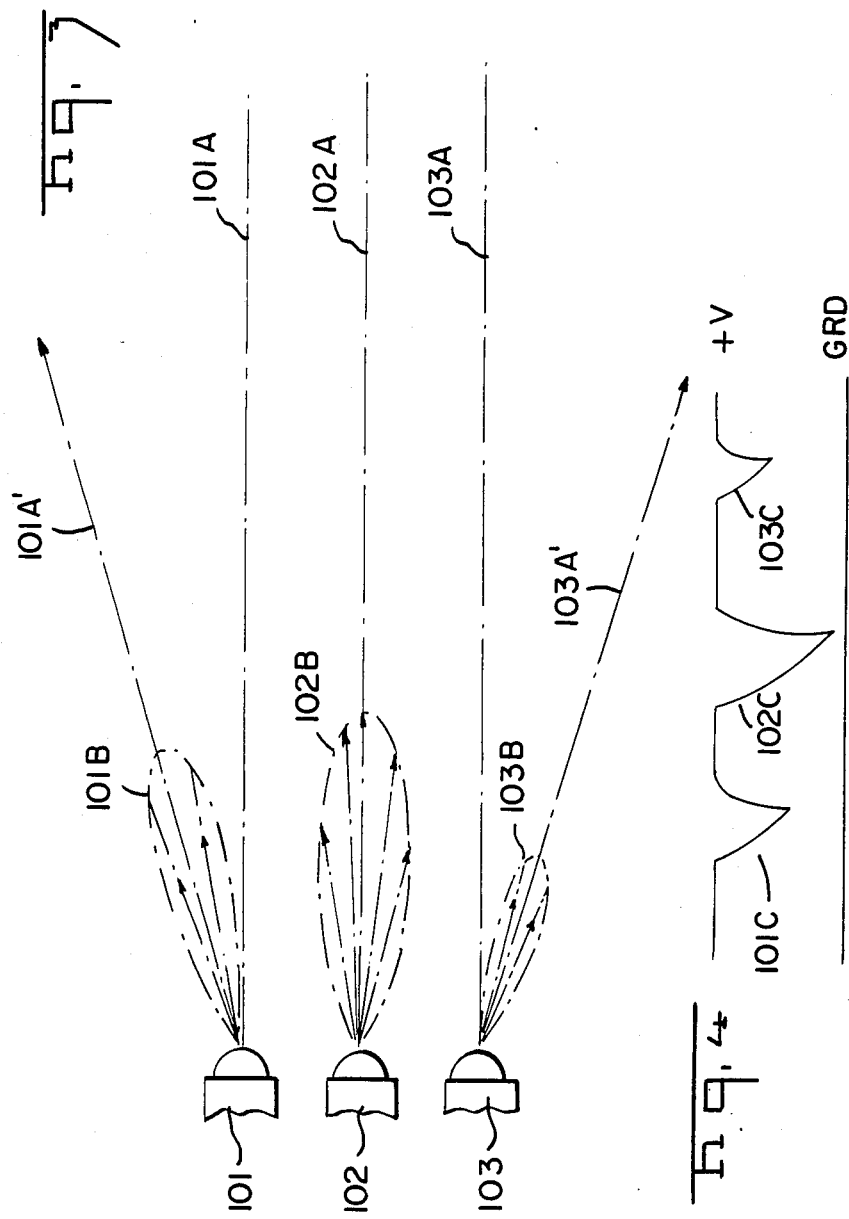

SIGNAL PRECONDITIONING FOR TOUCH ENTRY DEVICE

BACKGROUND OF THE INVENTION

1. Field of the Invention

This invention relates to the detection of a member interrupting one or more beams transmitted between an emitter and an associated detector in an irradiated field, and more particularly relates to touch input detection systems for determining the intrusion and the relative position of a stylus within an irradiated field generally adjacent to an electronic display and formed by a plurality of infrared emitter/detector pairs.

2. Description of the Prior Art

Detection systems comprising a plurality of light emitting and detecting pairs located around the periphery of an irradiated field have been employed in a number of applications. For example, infrared detector fields can be used as a safety interlock or an anti-intrusion system for preventing access to a certain area or as a safety barrier around a machine. One ever increasing use of such systems is as a touch input device to an electronic display. For example, an array of infrared light emitters and detectors can be positioned around the periphery of an electronic display such as a CRT or a flat panel display. A number of such systems employ an X-Y matrix of emitters and detectors with associated emitters and detectors being axially aligned in pairs. In such touch entry systems, the introduction of a stylus within the irradiated field in proximity to a portion of the display permits input for controlling the operation of a computer communicating with the electronic display and the touch input apparatus. An example of a touch input system utilizing opto matrix frames consisting of infrared emitters and detectors may be found in U.S. Pat. No. 4,267,443, "Photoelectronic Input Apparatus", issued on May 12, 1981.

Conventional infrared or light "type" touch input devices employ opto devices such as LEDs, photodiodes, and phototransistors, which are normally intended for near-looking applications. A touch input system would be characterized as a far-looking application. Near-looking applications are those applications in which the emitter and detector are located in close proximity. The majority of the applications for conventional infrared opto devices emitters and detectors employ a separation of only a few centimeters. Many touch input systems position the emitters and detectors more than a foot apart, and some have a spacing of several feet. In near looking applications in which the opto devices are closely spaced, the total power output of the devices is more critical than the on-axis intensity. Even so, conventional LEDs produced in the same process may range in light output by a factor of up to 4 to 1. Conventional phototransistors may range in sensitivity by the same factor. Therefore, when randomly paired together to form emitter/detector pairs, the output signals can vary over a range of 16 to 1 or even greater. This wide range of output signal can create difficulties in processing the output signals to determine broken beams.

Careful preselection of available opto devices is one method of obtaining acceptable performance for touch input systems. Many of the opto devices from any manufacturing batch must be excluded as totally unacceptable for use in touch input systems. Thus, devices at the low end of the distribution must be totally eliminated. This preselection is based on total power output rather than on-axis intensity so that even the "better" opto devices may not be suitable for use in touch input systems. Thus, devices which may pass a selection process based on total power output may fail when the alignment problems associated with mounting the devices are combined with low on-axis intensity. Random pairing of devices will result in some devices producing below minimum output signals. Generally, the opto devices in a touch input matrix are mounted on printed circuit boards, and the complete assembly is tested. Experience has demonstrated that at least one pair out of the nominal 64 pairs will have an output signal below a minimum acceptable value. The detection, isolation, replacement and retesting of the unsatisfactory devices requires manual intervention and adds increased cost to the manufacturing process. Furthermore, the current manufacturing process, traced to the performance limits of conventional opto devices, precludes the ability to set up a fully automated high volume production line.

The ability to use commodity type opto devices without requiring prescreening and rework inherent in conventional touch input systems would greatly reduce the manufacturing cost of touch input devices and significantly improve reliability. Ideally, the use of the lowest cost opto devices, making an opto manufacturer's total yield distribution suitable for use in touch systems, would not only reduce the direct cost of the opto devices themselves, but would reduce associated rework problems and lead directly to high volume automated manufacturing of touch input devices.

The invention, as illustrated by the preferred embodiment described herein, does not require extensive preselection of conventional opto devices, and thus leads directly to such manufacturing improvement. Furthermore, other advantages will accrue based upon the use of the invention described herein. For example, touch input systems employing signal preconditioning in the manner described herein can be used to compensate for environmental contaminates such as dirt or dust which reduce the output signal of opto pairs. Signal preconditioning also allows for special treatment at the edges of an opto matrix device, where reflection has traditionally been a problem. Signal preconditioning also permits a reduction in the LED drive current, allowing the selection of low current and lower cost multiplexing devices. In addition, lower LED drive current will extend the life of the LEDs. Low drive current also reduces the effect of thermal shock on LEDs. Signal preconditioning will also allow the selection of the devices to be independent of the matrix size and dimensions and will permit the devices to be used in higher ambient light environments. Furthermore, maintenance of touch input systems will be improved since replacement of failed opto devices will not require a selection process to insure suitable system operation.

SUMMARY OF THE INVENTION

An input detection system for detecting the intrusion of an opaque element, such as a stylus, into an irradiated field employs signal preconditioning or programmable amplification of the output of each detector in the opto matrix array. The preferred embodiment of this invention comprises a touch input system suitable for use in conjunction with an electronic display. Upon the introduction of a stylus, such as the operator's finger, into an invisible infrared irradiated field formed by an array of infrared emitters and detectors, the position of the stylus relative to the display can be determined. In this manner, information can be communicated directly through the display to a host computer controlling both the display and the scanning operation of the opto matrix touch input system. In the preferred embodiment of this invention, X and Y arrays of light emitting infrared LEDs are located on two sides of a frame. Similar X and Y arrays of infrared detectors, such as phototransistors, are located on the opposite sides of the array. The emitters and detectors are disposed in axially aligned emitter/detector pairs. Although the emitter and detector packages are axially aligned, the problems inherent with conventional opto devices do not insure that the light emitted and received from devices in the same pair are axially aligned. Only mechanical alignment of the device packages themselves can be established.

The emitter/detector array is employed in conjunction with a microprocessor computing system, which in the preferred embodiment of the invention, controls the sequential activation of the emitter/detector pairs and can communicate with a host computer controlling the display. An analog signal from the infrared detectors is converted to a digital signal for input into the microprocessor. However, the analog signal input into the analog to digital converter or converting circuitry is preconditioned to remove signal variations due to inconsistencies in the conventional emitters and detectors. A programmable amplifier responsive to the microprocessor preconditions the analog signals sequentially received from the light detecting phototransistors. The signals originally received from the photodetectors are individually amplified prior to input into the analog to digital converter to insure that all signals input into the analog to digital converter and output from the analog to digital converter to the microprocessor are essentially constant or are at least within a prescribed normalized range.

BRIEF DESCRIPTION OF THE DRAWINGS

FIG. 3 demonstrates the variations and total power intensity and on-axis intensity encountered with conventional light emitting diodes.

FIG. 4 demonstrates variation in signal strength corresponding to the emitters shown in FIG. 5.

DETAILED DESCRIPTION OF THE PREFERRED EMBODIMENT

Figure 1:
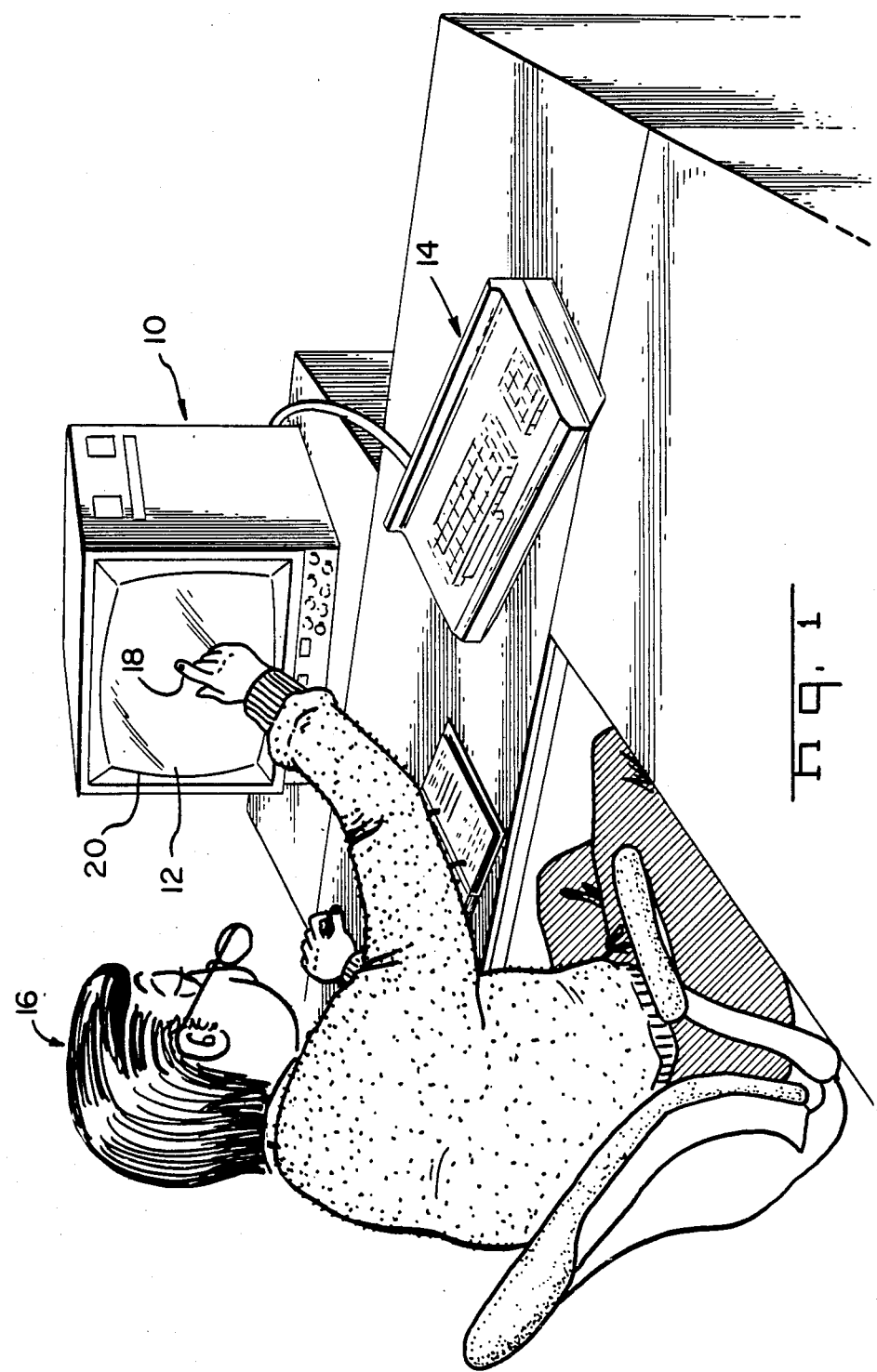
FIG. 1 is a view illustrating the operator's use of a touch input system positioned adjacent an electronic CRT display.

The preferred embodiment of this invention is intended for use in communicating with an electronic display which comprises an input and output means for a digital computer. As shown in FIG. 1, the operator 16 can communicate with the display 12 of a CRT 10 by positioning an opaque member such as his finger 18 in the touch sensitive area. Input to a computer through the display screen 12 is accomplished by use of an opto matrix touch input frame 20 which can be positioned adjacent the video display. The opto matrix frame 20 establishes an irradiated field adjacent the display which permits detection of an intruding stylus, such as the operator's finger 18, into the irradiated field and also determines a precise position relative to the video display. Thus, an operator 16 can simply choose one of several alternative inputs displayed at various locations on a screen, and can perform other interactions with the display 12, such as cursor control. By using infrared emitters and detectors, the beam pattern established within the irradiated field will not optically interfere with the electronic display. A touch input system of this type can be employed either as an alternative to or in addition to a conventional keyboard 14.

Figure 2:
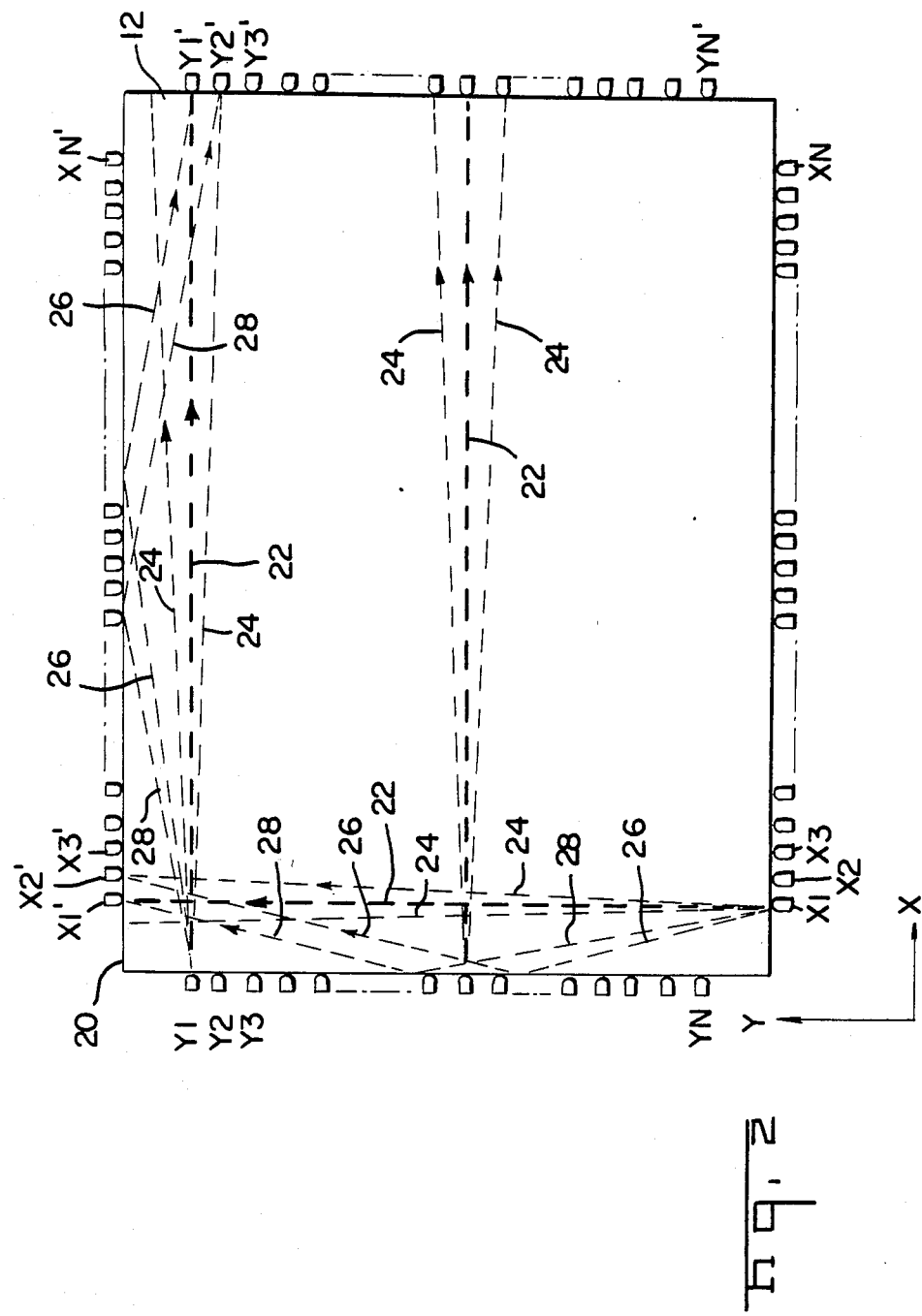
FIG. 2 is a view of an opto matrix frame illustrating the opto matrix beams.

FIG. 2 shows a conventional optical matrix 20 comprising a plurality of emitters and detectors located around the periphery of an intermediate irradiated field. In the preferred embodiment shown in FIG. 2, emitters are located along two sides of the rectangular matrix. Corresponding detectors are located along the opposite sides. A plurality of X emitters, X1, X2, ... XN, are located along the lower surface of the opto matrix frame 20. These X emitters comprise conventional infrared light emitting diodes and are generally positioned on predetermined centerlines along the lower periphery of the frame. Similarly, a plurality of Y emitters, Y1, Y2, ... YN, are located along the left side of the opto matrix frame 20. These Y emitters also comprise conventional infrared light emitting diodes and are spaced apart on the same centerlines. The X and Y emitters individually transmit beams within the irradiated field forming a grid of infrared beams.

A plurality of photodetectors, X1', X2', ... XN', comprising a linear array of photodetectors are positioned along the top of frame 20. In the preferred embodiment of this invention, these X photodetectors, X1', X2', ... XN', each comprise conventional infrared phototransistors. A similar linear array of Y photodetectors, Y1', Y2', ... YN', are positioned along the right side of frame 20. Individual photodetectors located along either the X axis or the Y axis are geometrically aligned with associated light emitting elements to form a plurality of emitter/detector pairs. For example, emitter X1 and photodetector X1' are axially aligned as shown in FIG. 2. In the preferred embodiment of this invention, the opto matrix frame 20 comprises a printed circuit board having the emitters and detectors affixed thereto on precise centerlines. Even though associated emitter/detector pairs are axially aligned, the light incident on each detector cannot be confined to the light emitted from corresponding LED. As shown in FIG. 2, normal dispersion of light insures that some portion of the light emitted from individual LED will be incident upon detectors adjacent the associated photodetector. Thus, although the light transmitted along the axis of alignment 22 between the emitter and detector will strike only the associated detector, light dispersed at a wider angle, as shown by rays 24, will strike adjacent photodetectors. Furthermore, reflection problems, which would normally occur adjacent the edges of the frame, further complicates the reception of light by the photodetector. As shown in FIG. 2, light at even greater dispersion, as represented by beams 26 and 28 can strike a surface, such as the bezel of a CRT along the edge of the opto matrix frame 20, and be reflected to strike an adjacent detector.

The beam pattern shown in FIG. 2 assumes that the light beams emitted from emitters such as X1 and Y1 are precisely centered around the axis of alignment between associated emitters and detectors. However, with conventional LEDs, such alignment cannot be maintained. FIG. 3 shows three side by side light emitting LEDs 101, 102, and 103. These LEDs 101, 102, and 103 can represent the light emitting patterns of LEDs arbitrarily distributed at any point within the emitter arrays. Although the emitters 101, 102, and 103 would be mechanically aligned along respective axis 101A, 102A, and 103A, the light emission pattern for each of these emitters would not be the same. The central emitter 102 shows a light emitting device having an on-axis optical dispersion. Light is evenly distributed around axis 102A as illustrated by a light envelope 102B. The strongest signal from LED 102 is coincident with the axis 102A and would, therefore, normally be incident upon a corresponding photodetector also aligned along axis 102A. LED 101, however, shows a conventional LED in which the optical intensity is not aligned with the geometrical axis 101A of the LED. Again, the envelope 101B, representative of the light emitted from LED 101, is along the axis 101A' rather than the axis 101A. Thus, although the overall power output of LED 101 is similar to the intensity of LED 102, as represented by the similarities between the envelope 101B and 102B, the amount of light radiated along axis 101A would differ significantly from that radiated along axis 102A. LED 103 illustrates a conventional emitter in which the light is not only emitted primarily along axis 103A', rather than 103A, but the overall power output, as represented by a comparison of envelopes 103B and 102B, is significantly less than that of an optimum LED 102. Although the envelopes 101B and 103B are centered around axis 101A' and 103A' respectively, showing no light incident upon axis 101A by LED 101, and along axis 103A, it should be understood that FIG. 3 is for representative purposes only. Of course, a certain amount of light would be radiated along axis 101A and 103A for a misaligned device having low intensity, such as LED 103. The important point represented by FIG. 3, however, is that these variations in intensity and alignment with conventional LEDs will result in differing amounts of light normally incident upon photodetectors positioned along axis 101A, 102A, and 103A.

FIG. 4 indirectly represents the intensity of light as seen by photodetectors. Note that the relative signal strength shown at 101C, 102C, and 103C is affected both by the relative intensity of the LEDs (compare 102B and 103B) and by the alignment and on-axis intensity of the emitted light (compare 101C and 102C). The considerations illustrated in FIGS. 2, 3, and 4 thus show that the signal from phototransistors within the array in a touch entry device will not be the same—thus creating problems in determining whether a detector has been blocked by the intrusion of an opaque element or stylus or whether the fully irradiated signal from the emitter merely falls in the low output range anticipated using conventional LEDs. It is this problem which has necessitated preselection of both LEDs and photodetectors, since photodetectors exhibit many of the same problems described with reference to light emitting diodes.

Figure 5:
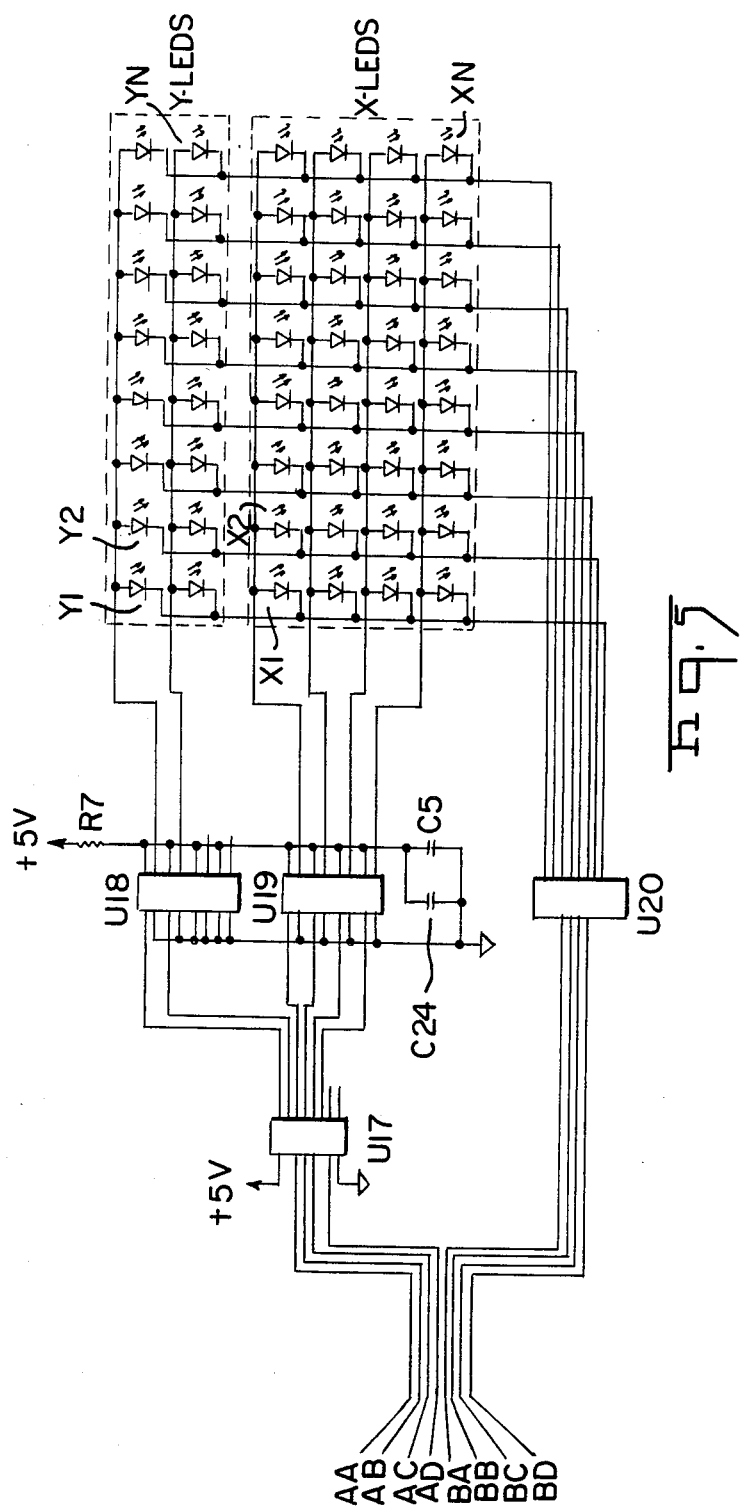
FIG. 5 shows the matrix of X and Y emitters.

FIG. 5 shows the emitter activation circuitry employed in the preferred embodiment of this invention. The array of X emitters X1, X2, ... XN and the array of Y emitters Y1, Y2, ... YN are interconnected in a matrix with the emitters and detectors being actuated by signals from a microprocessor. As shown in FIG. 5, the LEDs in this embodiment are configured in six banks or rows with the anode of the LEDs in each bank or row being commoned. The LEDs are also positioned in eight columns with the cathodes of LEDs in the same columns also being current sunk. Thus, each LED within the matrix is uniquely positioned and has a unique address within the matrix.

The individual rows or banks of LEDs are addressable by the microprocessor through four signal lines AA, AB, AC, and AD which serve to select which one of the six banks of source drivers to the LEDs is selected. These four signals feed a three line to eight line active high output decoder U17, which in the preferred embodiment of this invention comprises a 54HC237 active high output decoder. One of the active high outputs on this device is high at any one time, and that high output in turn activates one of six darlington pairs in the ULN2074B devices U18 and U19. The selected darlington pair turns on source current to one bank of infrared LEDs through a resistor R7, which in the preferred embodiment of this invention can be in the range of 1.0 to 30 ohms. The other axis of the infrared LED matrix is enabled using a 54LS145 4-line to 10-line binary coded decimal converter active low decoder U20. Decoder U20 is activated by the microprocessor through input signal lines BA, BB, BC, and BD. If only a single row and a single column is selected, only the single LED having that specific row and column address within the LED matrix will be activated in response to unique signals from the microprocessor.

Figure 6:
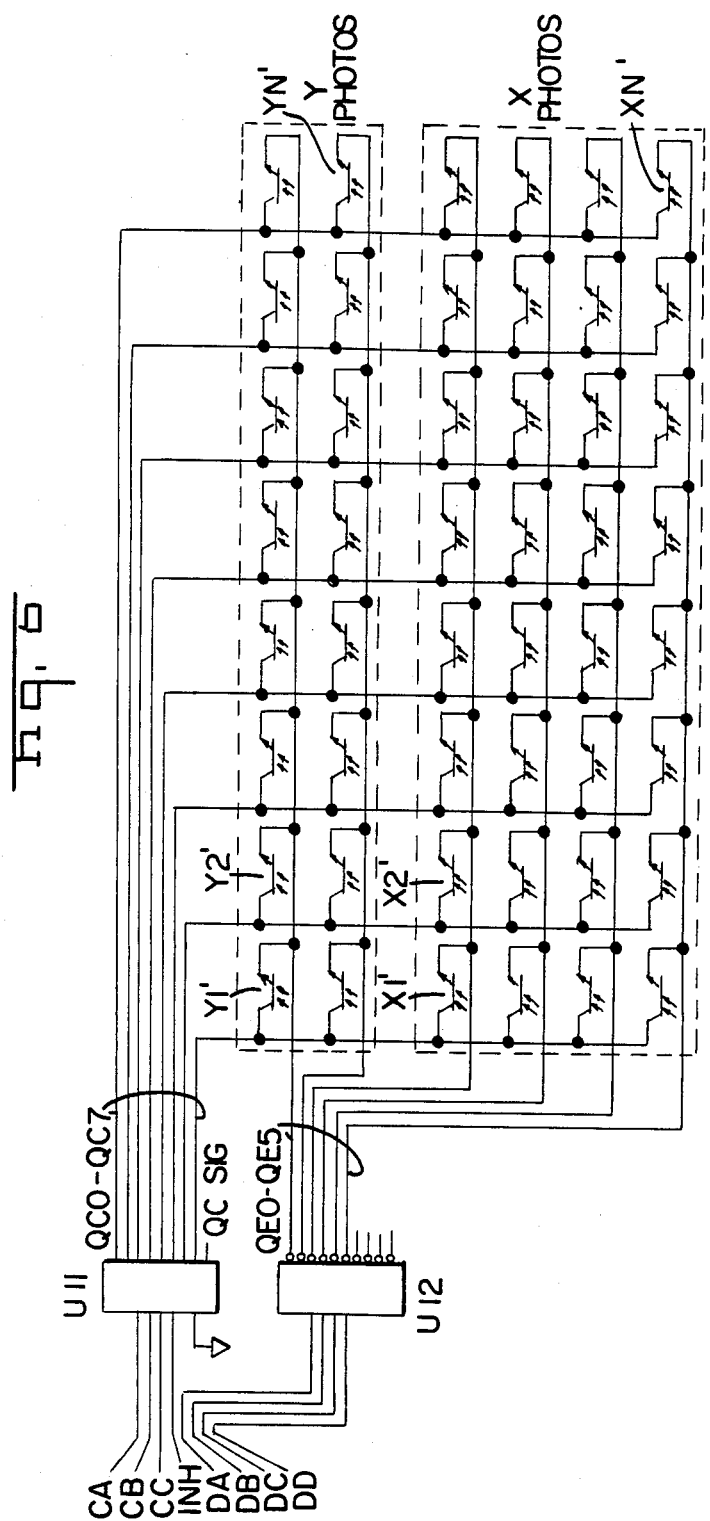
FIG. 6 shows a matrix of X and Y detectors in the form of phototransistors.

The matrix of photodetectors X1', X2', ... XN' and Y1', Y2', ... YN' are configured in a matrix as shown in FIG. 6 in a fashion similar to the emitter matrix. As shown in example of FIG. 6, the photodetectors are positioned in six rows and eight columns. Again, each individual phototransistor is sequentially selected by addressing the appropriate row and column corresponding to the unique address of the selected photodetector. Selection of the individual photodetectors is again controlled by the microprocesor. One axis of the matrix, one of the six rows of photodetectors, is selected by inputing signals DA, DB, DC, and DD from the microprocessor into a 54LS145 4-line to 10-line binary coded decimal decoder U12. The other axis, one out of 8 columns, of the photodetector matrix is selected using a 54HC4051 analog multiplexer U11. Signals CA, CB, and CC are input into analog multiplexer U11. One of the eight output lines from the analog multiplexer U11 is selected by the three input lines CA, CB, and CC. If no photodetector is selected, input line INH is driven high and the photosignal is held at a certain voltage level using resistors R1 and R11 shown in FIG. 8. That quiescent voltage level, which is labeled QCSIG is fed in the common IO pin of device U11. The signal detected on each selected photodetector will be riding on top of the quiescent level on QCSIG. The signal QCSIG feeds one port of an AD7528 dual digital to analog converter U5 shown in FIG. 9. The photosignal at QCSIG also drives an IO input pin of a 54HC 40 53 analog multiplexer-demultiplexer U8 shown in FIG. 8.

Figure 7:
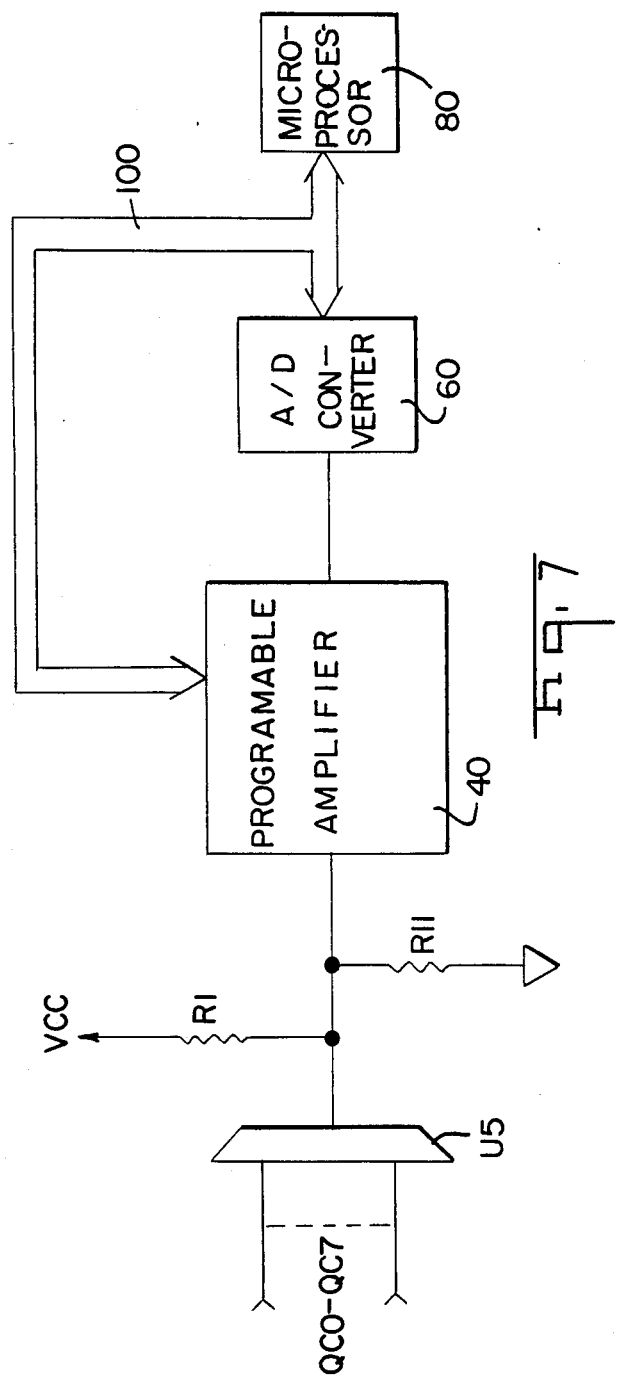
FIG. 7 shows the interrelationship of the various components necessary for signal preconditioning.

FIG. 7 is a schematic showing the elements for preconditioning a signal prior to transmission of that signal to an analog to digital converter. The signals QC0 to QC7 output from the photodetectors and input into the analog multiplexer U11 are output into a programmable amplifier 40. The amplified signals are in turn transmitted to an analog to digital converter 60. The digital signals from the analog to digital converter 60 are then transmitted to a microprocessor computing means 80. The microprocessor then compares the digital signals received from A-D converter 60 with a normalized range of signals for each photodetector. If the signals transmitted to microprocessor 80 do not fall within a prescribed normalized range, the signal is transmitted along bus 100 to programmable amplifier 40 to provide amplification for each of the signals. The system initializes itself by scanning the touch matrix and sequentially reading, composing and writing to the programmable amplifier until each address signal from the matrix is within a prescribed range. These initial signals are transmitted upon initial activation of the touch input system prior to the use of the device to detect a stylus located within the irradiated field of the matrix. In response to the signal received from the microprocessor 80, the programmable amplifier 40 applies an appropriate gain to the signals received from respective photodetectors, and the analog photodetector signal multiplied by an appropriate gain in amplifier 40 is then transmitted to the A-D converter 60. The digital signals are stored in memory within the microprocessor 80 until all signals are sufficiently amplified. This feedback loop operation continues until all of the signals from all of the photodetectors are within the appropriate normalized range. At this point, the various gains for individual photodetector pairs are stored within the microprocessor memory. The device is then in condition to permit detection of a stylus located at any position within the irradiated field.

Figure 8:
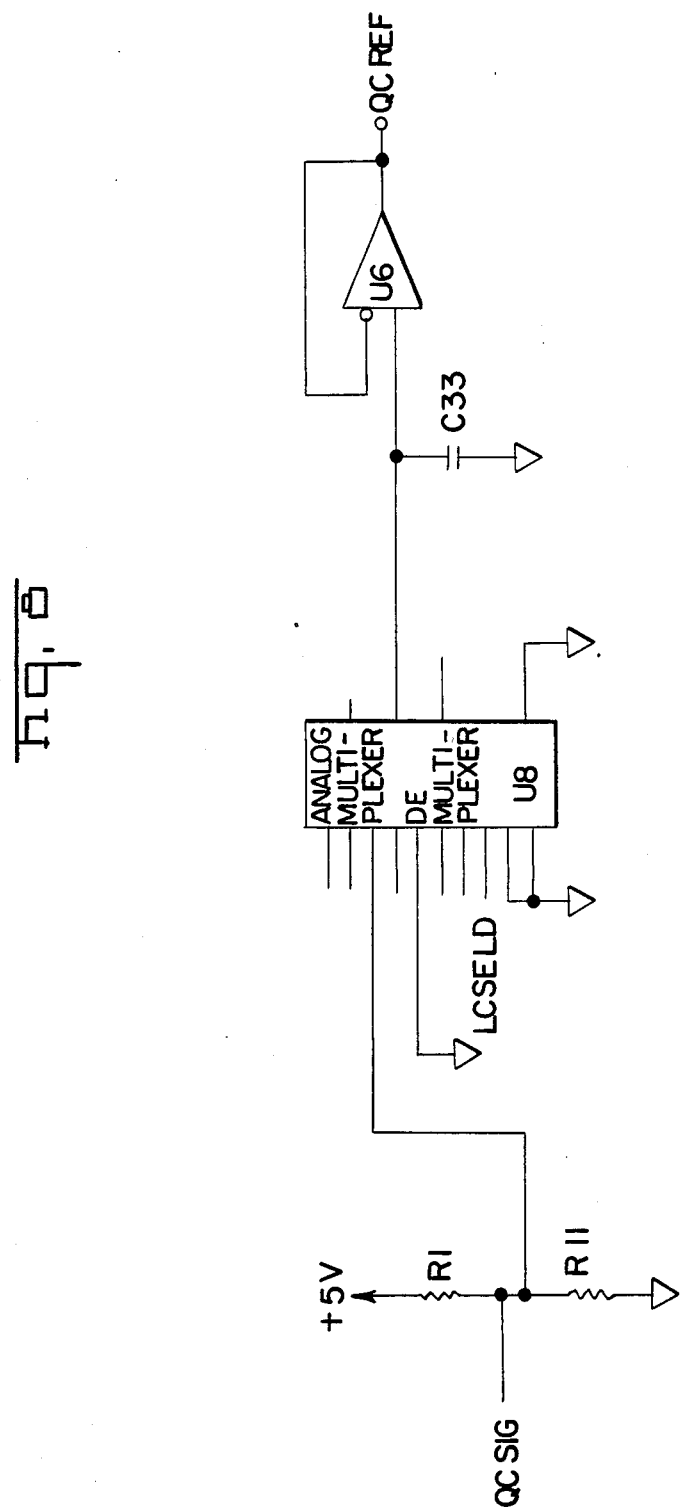
FIG. 8 shows a portion of the programmable amplification circuit employed in the preferred embodiment of this invention, including an analog multiplexer-demultiplexer used as an analog switch and a sample and hold circuit.
Figure 9:
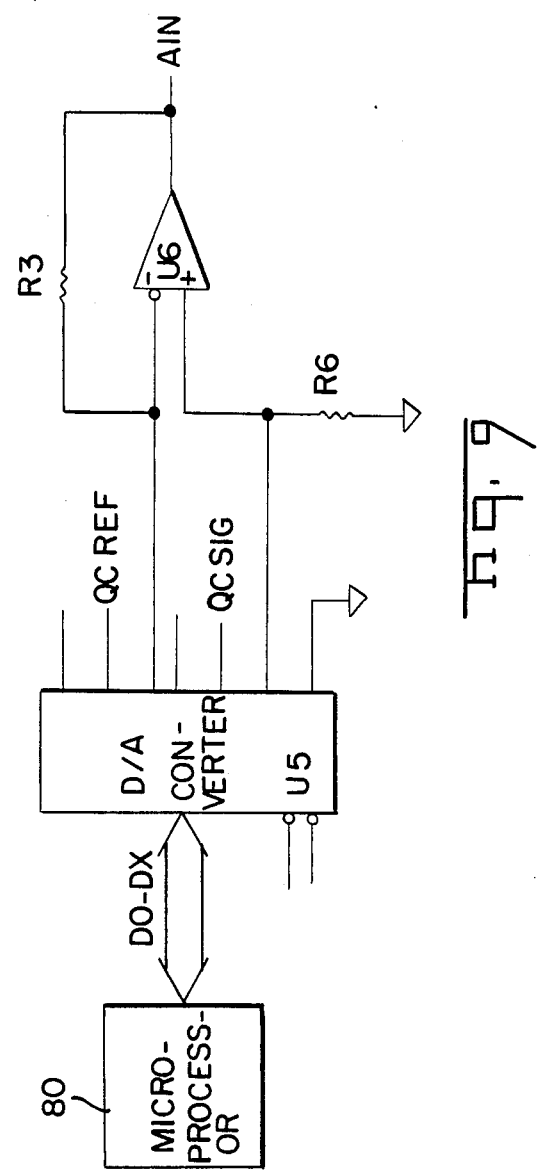
FIG. 9 shows the remainder of the programmable amplification means consisting of a dual digital to analog converter and a difference amplifier.
Figure 10:
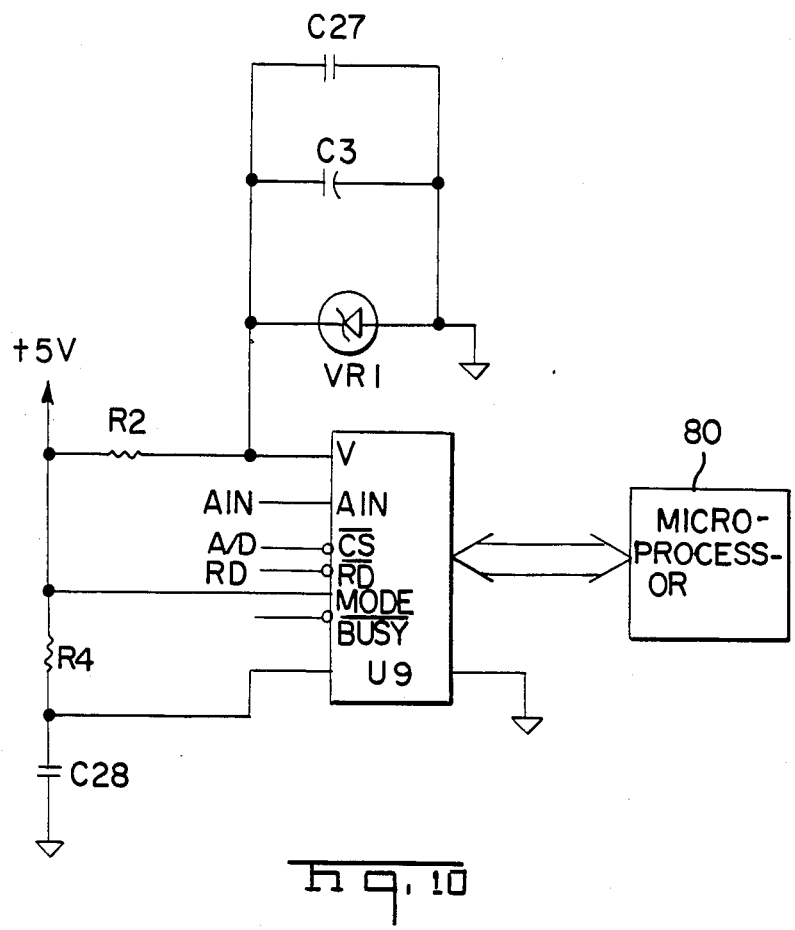
FIG. 10 shows an analog to digital converter receiving preconditioned signals from the programmable amplifier and inputing a digitized signal into a digital microprocessor.

Operation of the programmable amplifier in conjunction with the analog to digital converter will be described with reference to the preferred embodiment of this invention in FIGS. 8-10. The identification of specific devices employed in preconditioning signals using programmable amplification is not intended to exclude other conventional devices known to one skilled in the art. FIG. 8 shows an analog switch and a hold circuit which comprises a part of the programmable amplifier 40 shown in FIG. 7. The analog multiplexer-demultiplexer U8, into which the photosignal QCSIG is input, is used as an analog switch. When switch U8 is closed, the voltage on QCSIG resides on capacitor C33. With switch U8 closed, which occurs when LCSELD goes high, the signal that was on QCSIG will remain on C33 until the switch is again open. The TLC274A opamp U6 serves as a high impedance buffer for a capacitor C33.

The output QCREF of the high impedance buffer and QCSIG are in turn input into an AD7528 non-buffered ladder-type dual digital to analog converter (DAC) U5. The dual digital to analog converter is used to feed a TLC274A opamp U7. This device is configured as a differential amplifier with a gain determined by the dual digital to analog converter and resistors R3 and R6. Appropriate selection of the values of resistors R3 and R6 gives an approximate range of gain of 1 to 256. The output AIN of the differential amplifier U7 shown in FIG. 9, is in turn input into an AD7576 analog to digital converter U9. This analog to digital converter converts the analog signal into a digital level value is read by the microprocessor 80.

A touch entry device employing programmable amplification in the manner described herein, is also capable of adjusting for variations in the signal level over time. A certain signal level or reference value may be established within the computing means to identify interruption of a beam by the intrusion of an opaque member such as a stylus. For example, a change in signal level of 50% or more may be identified as a broken beam condition. Any change less than this fractional signal level can be considered a change in the output of the opto devices which must be adjusted by changing the programmable amplification for that signal.

Other appropriate programmable amplifier configurations may be employed in conjunction with this invention, but the preferred embodiment of this invention provides a means of emulating a touch input matrix having consistent output emitters and consistent response detectors within the array.

We claim:

1. An input detection apparatus for detecting the intrusion of an opaque element into an irradiatd field comprising:

an array of light emitting means and an array of light detecting means, located on the periphery of the irradiated field, individual light emitting means being aligned with associated individual light detecting means, intrusion of the opaque element into the irradiated field blocking light from at least one individual light emitting means normally incident on the associated light detecting means;

analog to digital converting means, responsive to an analog signal dependent upon the intensity of light incident on each light detecting means, for transmitting a digital signal corresponding to the analog signal;

digital computing means receiving the digital signal from the analog to digital converting means, the digital computing means comprising means for denoting the absence of incident light on individual light detecting means to detect the intrusion of an opaque element into the irradiated field, and programmable amplification means responsive to the digital computing means for preconditioning the analog signal from the light detecting means upon detection of unblocked incident light, the preconditioned analog signal being input to the analog to digital converting means.

2. The apparatus of claim 1 wherein the on-axis intensity of the unblocked light incident upon individual light detecting means in the same array is unequal within the array.

3. The apparatus of claim 2 wherein the on-axis intensity of separate individual light emitting means in the same array is unequal within the array.

4. The apparatus of claim 3 wherein the programmable amplification means comprises means for inputing the same preconditioned signal from all of the light detecting means into the analog to digital converting means.

5. The apparatus of claim 3 wherein the digital computing means comprises means for comparing the intensity of an initial signal dependent upon unblocked light incident on each light detecting means with a normalized range of signal intensity and selectively amplifying individual signals to bring the signals within the normalized range.

6. The apparatus of claim 3 wherein the digital computing means comprises means for comparing the digital signal output from the analog to digital converting means with a predetermined reference value equal to a fraction of the unbroken signal to determine if the light is blocked by intrusion of an opaque element.

7. The apparatus of claim 3 wherein the programmable amplification means comprises a sample and hold circuit, a digital to analog converter and a differential amplifier.

8. The apparatus of claim 7 wherein the digital to analog converter comprises means for varying the amplification in response to the signal received by the computing means from the analog to digital converter.

9. The apparatus of claim 8 wherein the digital to analog converter comprises variable resistance means.

10. The apparatus of claim 9 wherein the digital to analog converter comprises an open-loop, non-buffered ladder-type dual digital to analog converter.

11. A method of detecting an input to a touch sensitive device comprising an array of light emitters and an array of light detectors located on the periphery of a display field, the light emitters and the light detectors being configured in aligned emitter/detector pairs, such that intrusion of an opaque element into the display field blocks light between associated emitters and detectors in at least one emitter/detector pair, the method comprising the steps of:

sequentially energizing emitter/detector pairs prior to intrusion of an opaque element;

converting an analog signal from each detector to a digital signal and inputing the digital signal into digital computing means;

comparing each digital signal with a normalized range and storing the digital signal in memory;

separately amplifying subsequent analog signals from each detector prior to conversion of the subsequent analog signal to a subsequent digital signal in response to the comparison between the previous digital signal and the normalized range; and replacing the previous digital signal by the subsequent digital signal in memory until each digital signal in memory is within the normalized range and updating the amplification of each subsequent analog signal until the corresponding digital signals are within the normalized range.

12. The method of claim 11 wherein the digital computing means comprises a microprocessor.

* * * * *